(12) United States Patent
Wang

(10) Patent No.: US 11,294,206 B2
(45) Date of Patent: Apr. 5, 2022

(54) PERFORMANCE PREDICTION AND MAINTENANCE OF AN OPTICAL TRANSMITTER

(71) Applicant: ARRIS Enterprises LLC, Suwanee, GA (US)

(72) Inventor: Jun Wang, Warrington, PA (US)

(73) Assignee: ARRIS Enterprises LLC, Suwanee, GA (US)

( * ) Notice: Subject to any disclaimer, the term of this patent is extended or adjusted under 35 U.S.C. 154(b) by 179 days.

(21) Appl. No.: 16/221,402

(22) Filed: Dec. 14, 2018

(65) Prior Publication Data
US 2020/0192127 A1 Jun. 18, 2020

(51) Int. Cl.
| | |
|---|---|
| G02F 1/03 | (2006.01) |
| G02B 26/00 | (2006.01) |
| G02B 6/12 | (2006.01) |
| G02F 1/015 | (2006.01) |
| G02F 1/01 | (2006.01) |
| H01S 5/024 | (2006.01) |
| H01S 5/026 | (2006.01) |

(52) U.S. Cl.
CPC ............ *G02F 1/015* (2013.01); *G02F 1/0123* (2013.01); *H01S 5/0265* (2013.01); *H01S 5/02407* (2013.01); *G02F 1/0157* (2021.01)

(58) Field of Classification Search
CPC ..... G02F 1/12255; G02B 5/23; G02B 26/001; G02B 6/43; H01L 29/2003; H01L 29/0657; H04B 10/505; B82Y 20/00; H01S 3/0604; H01S 3/113; H01S 3/1109; H01S 3/16; H01S 3/0941

USPC ..... 359/245, 241, 240, 248, 237; 372/45.01, 372/45.011, 7, 11, 18, 43, 45, 48, 68, 75; 257/14–15, 18, 189, 622–623; 385/2, 14, 385/31; 398/198
See application file for complete search history.

(56) References Cited

U.S. PATENT DOCUMENTS

| | | | |
|---|---|---|---|
| 9,479,263 B2 | 10/2016 | Schemmann et al. | |
| 2003/0043448 A1* | 3/2003 | Bond | ............ G02F 1/025 359/248 |

(Continued)

OTHER PUBLICATIONS

Milind Gokhale, "20 and 26 Gbps uncooled 1310nm EMLs for 100 GbE applications", IEEE High Speed Study Group, Apogee Photonics, Jan. 2007, 13 pages.

*Primary Examiner* — Dawayne Pinkney
(74) *Attorney, Agent, or Firm* — Chernoff, Vilhauer, McClung & Stenzel, LLP

(57) ABSTRACT

In one embodiment, an electro-absorption modulator is configured to receive an optical light from an optical light source and outputs a modulated optical signal. The electro-absorption modulator includes a bias voltage that is used to set optimum predetermined modulation performance and an output power of the electro-absorption modulator. A controller is configured to measure a bias current of the optical light source and use a change of the bias current to determine a detuning change that occurs between the electro-absorption modulator and the optical light source. The controller uses the detuning change to automatically control the bias voltage of the electro-absorption modulator to maintain the predetermined modulation performance and maintain the output power of the electro-absorption modulator.

20 Claims, 8 Drawing Sheets

(56) References Cited

U.S. PATENT DOCUMENTS

| | | | | |
|---|---|---|---|---|
| 2004/0090659 A1* | 5/2004 | Zhang | ............... | G02F 1/0123 359/240 |
| 2012/0162743 A1* | 6/2012 | Okada | ............... | G02F 1/0123 359/248 |
| 2015/0288457 A1* | 10/2015 | Schemmann | ............ | H04N 7/22 398/194 |

* cited by examiner

PERFORMANCE PREDICTION AND MAINTENANCE OF AN OPTICAL TRANSMITTER

BACKGROUND

Optical communications systems use modulated light, e.g., optical signals, through light channels or fiber optic cables to transmit information between devices. For example, long distance transmission of broadband signal content, such as analog multichannel video, may include the use of narrow line width light sources in conjunction in a low loss wavelength window of single mode optical fibers (SMF). In optical communication systems, a light beam is modulated in accordance with the information to be conveyed and transmitted along the optical fiber to a receiver.

The typical lowest loss of the SMF fiber window is in the convention band (C-band). In addition to the low loss in this window, the availability of the optical amplifier in this wavelength window is another advantage. There are two types of modulation that can be used for the light modulation, direct modulation and external modulation. In the direct modulation transmitter, light of a distributed feedback laser (DFB) laser is directly modulated through the modulation of the current going to the laser. In an external modulation transmitter, the light from the light source is modulated by an optical external modulator.

The direct modulation transmitter is a cost-effective solution for many applications. Accompanying the intensity modulation of the light is the frequency modulation of the light, known as laser chirp. However, one factor that the optical transmission system needs to consider is the fiber dispersion. The interaction of the laser chirp with the fiber dispersion can cause some undesirable performance degradations, such as second order distortion in analog hybrid fiber coax (HFC) cable television (CATV) transmission systems. The distortion can be corrected through an electronic circuit. However, since the fiber dispersion is the function of fiber length, the distortion correction has to be set for each targeted fiber length. Therefore, this may add some additional tuning during network implementation. Also, this may cause some limitations in certain applications. For example, when the light is split in the transmission path and each portion of the split light travels down to different fiber lengths, performing a distortion correction becomes difficult to satisfy both transmission lengths. The other example is when a primary link and a secondary link have different link lengths the distortion correction needs to be reset after a switching happens between the primary and secondary path. Furthermore, the electronic distortion correction has its own limit in terms of its correction capability, which limits the total transmission link length.

To overcome the aforementioned drawbacks of the directly modulated transmitter, an external modulation transmitter may be used, especially for long reach transmission applications since external transmitters are close to chirp free. There are different types of external modulator technologies, such as a lithium niobite (LN) based Mach-Zehnder (MZ) modulator and an electro-absorption based modulator.

For LN MZ transmitters, the light from the light source is split equally and each split is sent to phase modulator path in the MZ modulator. The phase of the light from each path is controlled by the voltage applied to the phase modulator through an electro-optic effect. The lights from the two paths of the phase modulator are then combined and interfere. If the phase difference between the two light beams are zero degrees, then the max optical output power is achieved. If the phase difference between the two light beams is 180 degrees, then the minimum optical output power is achieved. The LN MZ based external modulator thus provides very good analog performance over long transmission distance not only because its low modulator chirp, but also because of its intrinsic good second order distortion performance if biased at its quadrature point. However, LN MZ transmitters also suffer some drawbacks. First of all, the optimal second order distortion performance can only be achieved at a quadrature point of the modulator transfer function and a small bias deviation from that point makes the distortion degrade very quickly. Therefore, the modulator voltage bias for the optimal performance needs to be constantly monitored and controlled because of its drift. Secondly, the modulator is bulky. Thirdly, it is very costly as compared to the directly modulated transmitter.

An electro-absorption (EA) based external modulator is based on the Franz-Keldysh effect or quantum-confined Stark effect, where the effective band gap of the semiconductor of the absorption material of the modulator changes with its bias voltage. The absorbed light is converted to photocurrent and therefore the electro-absorption modulator (EAM) works in a similar way to that of a photodetector. When no bias voltage is applied to the electro-absorption modulator, the band gap is wide enough to allow the light at the laser wavelength to pass through transparently. As the bias voltage is increased, the band gap is narrowed enough to start absorbing the light. Therefore, changing the bias voltage of the electro-absorption modulator modulates light. The electro-absorption modulator based external transmitters have several advantages. First, the electro-absorption modulator has a much lower chirp as compared to the directly modulated DFB laser. Second, the electro-absorption modulator requires a low bias voltage and driving power for modulation. Third, the electro-absorption modulator can be integrated with a DFB laser to form a device called an EML (electro-absorption modulated laser). Because of this integration, the EML device is very small with a package similar to a normal DFB laser, and therefore very cost effective. Like LN MZ modulator, the optimal second order distortion is achieved only when the modulator is biased at its inflection point of its extinction ratio (ER) curve. However, EA modulators also have some drawbacks. First, also like the LN MZ modulator, a small EAM bias deviation can make transmitter distortion degrade very fast or the bias voltage needs to stay in an extremely narrow window in order for distortions to be acceptable. Second, its optimal distortion bias voltage is a function of wavelength of the light and therefore a change in light wavelength induced for any reason can cause a system performance degradation.

Throughout the lifetime of a laser, its threshold (e.g., the laser bias current at which the laser turns on and starts emitting light) becomes larger, and its slope efficiency becomes smaller because of laser aging effects. Thus, the laser output power becomes smaller over time for a fixed laser bias current. An automatic power control circuit (APC) is designed to track the laser power by monitoring the laser power by a way, such as a back-facet photocurrent, and then increase the laser bias current to maintain the laser output power. However, the bias voltage increase of the laser causes wavelength of the laser to change. In electro-absorption modulator based transmitters, the modulator performance is affected unfavorably by the wavelength change due to the fact that EA modulator performance is a function of laser wavelength relative to the modulator's highest absorption wavelength.

DETAILED DESCRIPTION

Described herein are techniques for an optical transmission system. In the following description, for purposes of explanation, numerous examples and specific details are set forth in order to provide a thorough understanding of some embodiments. Some embodiments as defined by the claims may include some or all of the features in these examples alone or in combination with other features described below, and may further include modifications and equivalents of the features and concepts described herein.

Some embodiments predict performance of an electro-absorption modulated laser (EML) and perform automatic performance control of the EML transmitter over its lifetime in a network, such as in optical cable transmission networks. Some embodiments predict and produce an EML based transmitter's performance over its lifetime and then establish a predetermined electro-absorption modulator (EAM) bias curve for the optimal EML transmitter performance over its lifetime. An automatic EAM bias control circuit derives the EAM bias from the predetermined bias curve based on a laser bias current change over its lifetime. The prediction and adjustment process maintain the EML transmitter's optimal performance over its lifetime.

Figure 1:
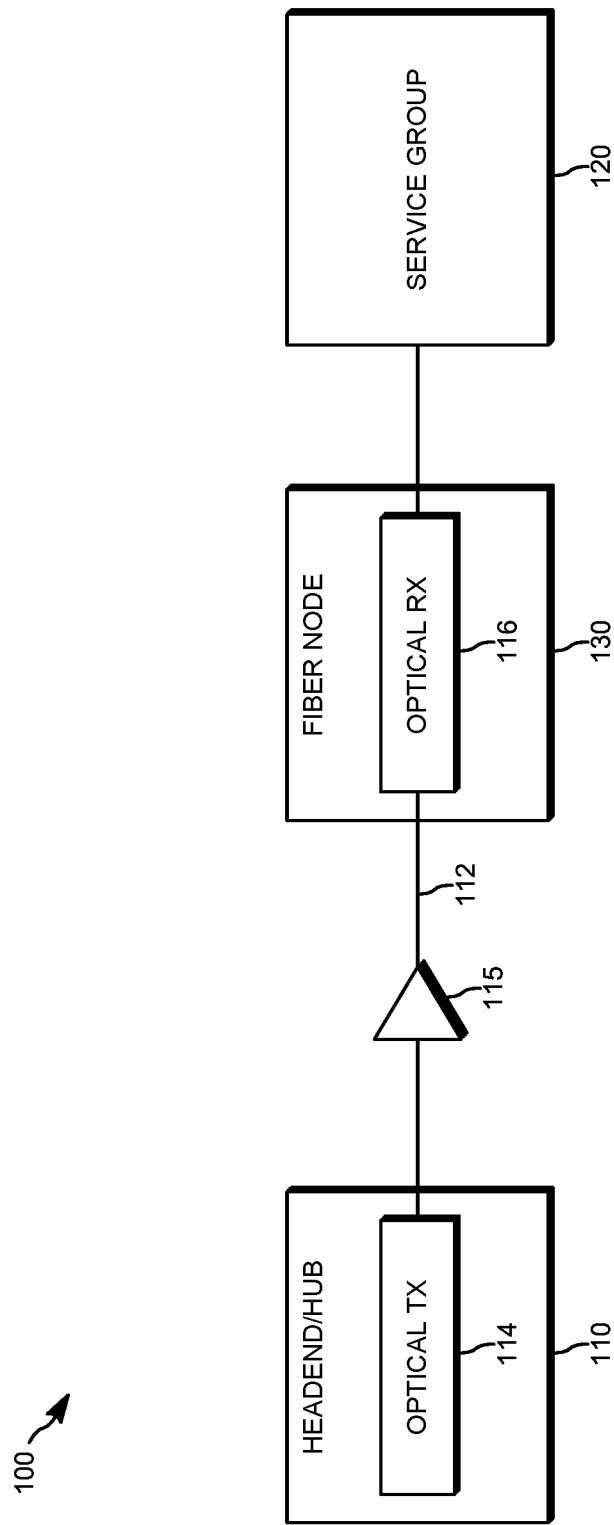
FIG. 1 illustrates an example optical communication system according to some embodiments.

FIG. 1 illustrates an example optical communication system 100 according to some embodiments. System 100 delivers analog and/or high-definition digital entertainment and telecommunications, such as video, voice, and high-speed Internet services, over a fiber connection 112 between a headend/hub 110 and fiber node 130 for delivery to a service group 120 of receiving devices such as cable modems (CMs) and/or set top boxes (STBs). In an optical communication system, information is transmitted via message signals through a physical medium from a source to a destination. For example, a cable-based system can be used to deliver analog and/or high-definition digital entertainment and telecommunications, such as video, voice, and high-speed internet services, from a headend to subscribers over an existing cable television network using optical signals. The cable television network can take the form of an all-fiber network or hybrid fiber/coax (HFC) network. In either network, an optical communication system, such as an optical transmitter, in a headend/hub converts electrical signals (e.g., data, video, and voice signals) to optical signals. The optical signals are transmitted downstream via a fiber to a fiber node that serves a group of end users (e.g., a service group). The fiber node can include an optical receiver that converts the received optical signals to electrical signals that then are transmitted to the service group, for example, via receiving devices such as cable modems (CMs) and/or set top boxes (STBs).

An optical transmitter (TX) 114 in the headend/hub 110 may convert electrical signals representing various services (e.g., video, voice, and Internet) to optical signals for transmission over the fiber 112 to the fiber node 130. The optical signal from the transmitter 114 may be amplified by an optical amplifier 115 (e.g., an erbium doped fiber amplifier (EDFA)) before reaching the fiber node 130. An example EDFA 115 is shown between headend/hub 110 and the fiber node 130, but it is noted that the EDFA 115 may be located in the headend/hub 110 and/or in the fiber node 130 or along the fiber.

A single fiber node 130 is shown in FIG. 1, but it should be understood that a network of nodes may exist between the headend/hub 110 and the service group 120 for delivery of cable services to consumers, and networks may be designed with fiber, coax, or a combination thereof for transmission of optical and/or electrical signals. In the example system shown in FIG. 1, the fiber node 130 includes an optical receiver (RX) 116 that converts the received optical signals to electrical signals. The electrical signals then are transmitted to service group 120.

In fiber transmission systems, especially long transmission systems, external modulator based transmitters may be used. Among external modulator technologies, electro-absorption laser (EML) based transmitters provide the required system performance. An EML based transmitter includes some unique performance advantages because of its extremely low chirp, its small package size and its low cost. A chirp is a signal in which the frequency increases (up-chirp) or decreases (down-chirp) with time. EML based transmitters produce the external transmitter performance at a cost close to DFB based transmitters.

For network implementations, such as an HFC network, the EA modulator can also offer good second order distortion performance if biased at the inflection point of its extinction ratio curve. However, for the external modulator, whether a LN MZ modulator or an EA modulator, the optimum bias voltage for the good second order distortion performance needs to be tightly controlled because the bias window for an acceptable second order performance is very narrow. MZI optical modulators fabricated in lithium niobate (LiNbO) have been shown to be sensitive to thermal and mechanical stresses that cause dynamic shifts of the quadrature bias point. For these reasons, the bias point of a typical external modulator may vary due to temperature variations, signal fluctuations, manufacturing tolerances and other environmental factors. If the proper bias point is not maintained, the modulator will exhibit stronger nonlinearity, especially even-order harmonics and the reduction of the signal strength in one of the outputs. The variations induced by stresses therefore require an active control to maintain an optimum distortion performance.

The electro-absorption modulator (EAM) may suffer from a similar problem when the modulator is packaged separately from the laser package and therefore may need similar tight control of the modulator bias as described for MZI based modulators. However, when integrated with the DFB laser, the modulator is hermetically packaged together with the laser in the EML laser module. For this reason, the temperature of the DFB laser and EAM are set the same and maintained because the temperature of both is controlled by a temperature source, such as a thermoelectric cooler (TEC). Therefore, in theory, the bias is not affected by the environmental temperature and some other conditions if the laser bias and EAM bias are stable.

Figure 2:
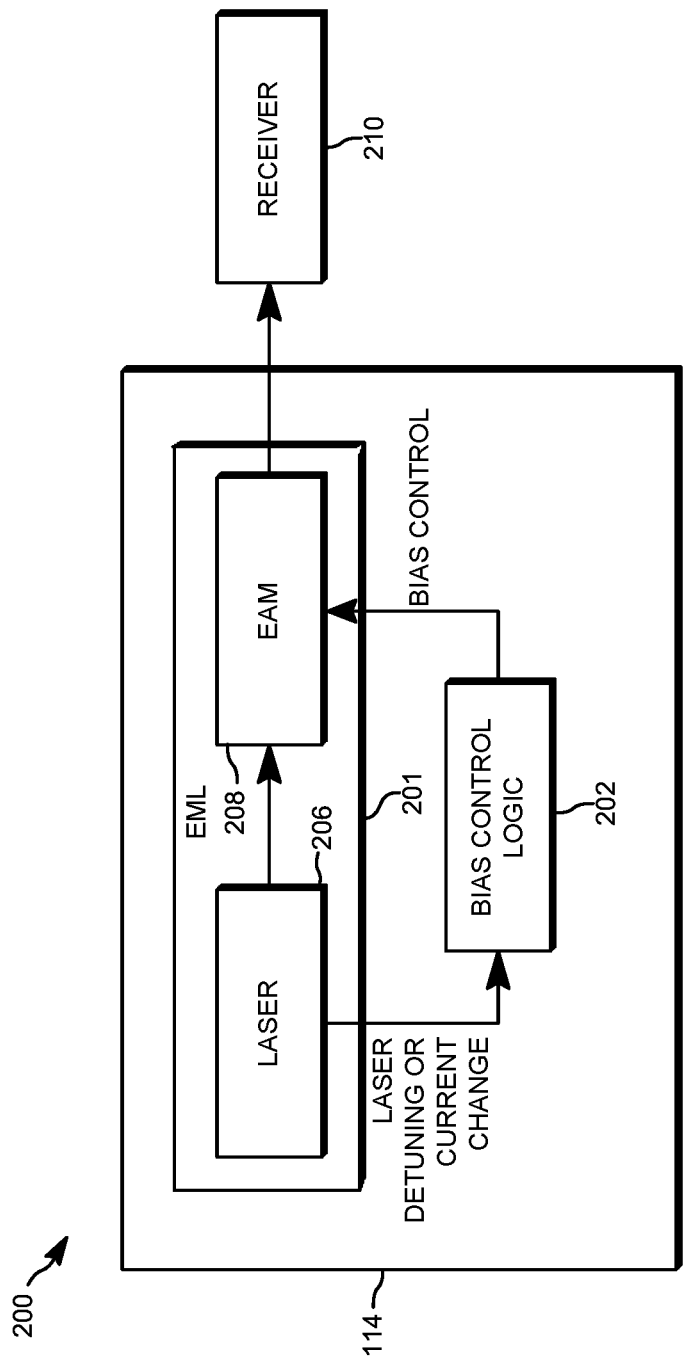
FIG. 2 depicts a simplified system for a transmitter that includes bias control logic for an electro-absorption modulated laser (EML) according to some embodiments.

The EML's modulation characteristic is described by an extinction ratio (ER) curve, which is the normalized transmission coefficient versus EAM bias voltage. The characteristic of the ER curve, such as its shape and its relative position, is determined by a parameter, called wavelength detuning. FIG. 2 depicts a simplified system 200 for an transmitter 114 that includes bias control logic 202 for an EML 201 according to some embodiments. EML 201 includes an optical light source, such as a laser 206, that outputs a light that is received by EAM 208 included in EML 201. EAM 208 absorbs the light, which is converted to photocurrent. Photocurrent is the electric current from EAM 208 that is the result of absorption of radiant power. As described above, the effective band gap of the semiconductor of the absorption material changes with its bias voltage. When no bias is applied to EAM 208, the band gap is wide enough to allow the light at the laser wavelength to pass through transparently. As the bias voltage is increased, the band gap is narrowed enough to start absorbing the light. Therefore, EAM 208 with its changing bias voltage offers its capability of modulating light. The modulated light from EAM 208 is output by EML 201 and transmitted to a receiver 210, which may be an optical receiver at a node.

Figure 3:
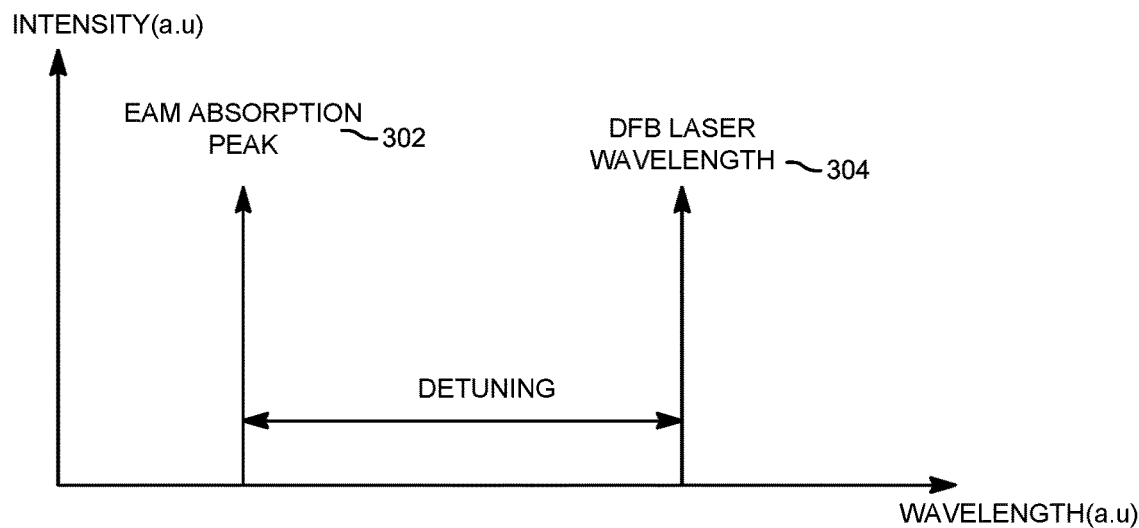
FIG. 3 depicts a graph showing the wavelength detuning relationship according to some embodiments.

As mentioned before, a predetermined modulation performance, such as a predetermined optimal second order distortion or even order distortion, is achieved only when the modulator is biased near its inflection point of its extinction ratio (ER) curve. The EAM modulation extinction ratio curve and thus the absorption are a function of wavelength detuning. FIG. 3 depicts a graph showing the wavelength detuning relationship according to some embodiments. The graph shows that the detuning is defined as wavelength difference between the DFB laser wavelength at 304 and the EAM peak absorption wavelength at 302 according to some embodiments.

Figure 4:
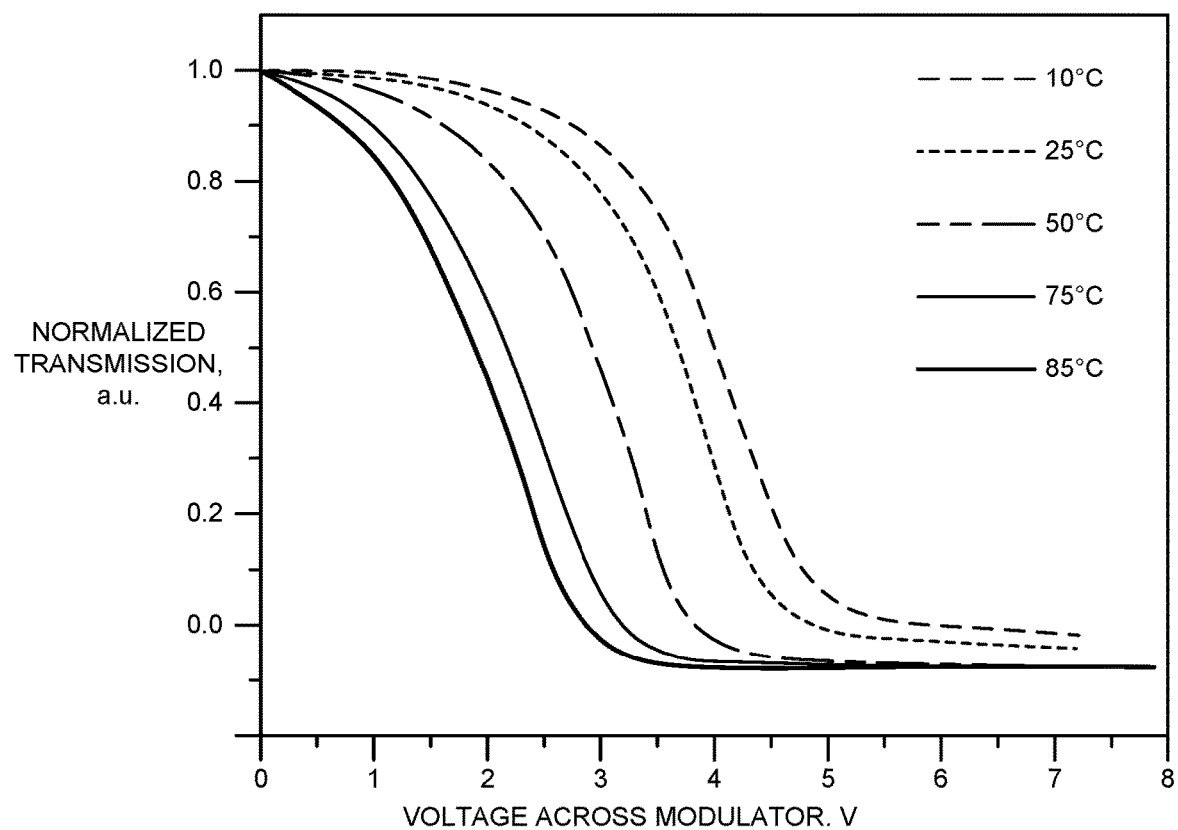
FIG. 4 depicts an example of extinction ratio (ER) curves versus different temperatures or detuning according to some embodiments.

Wavelength detuning can also be changed by the EML temperature because temperature coefficients of the EAM and the DFB are different. FIG. 4 depicts an example of ER curves versus different temperatures or detuning according to some embodiments. The detuning may result in a different absorption by the modulator, which changes the modulation performance of the EAM 208. In addition to the movement along the ER curve due to the bias voltage, the shape of the ER curve is also changed when the temperature changes. For example, the ER curve changes as the temperature changes from 10° C. to 85° C. Therefore, the EML transmitter performance in terms of transmitter output power and modulation performance will change because of the detuning change for a fixed EAM bias voltage. For example, if an EML 201 based transmitter is used for HFC applications or other applications, EML 201 may need to produce a very good linearity for a good analog performance and a good carrier to noise ratio. A good second order or even order distortion performance is achieved when the EAM 208 is biased near the inflection point of its ER curve. The inflection point is where the ER curve changes in its curvature from concave up to concave down. Like in the LN MZ modulator, the EAM bias window for a good composite second order distortion performance is very narrow around the inflection point of the ER curve. It is therefore strongly desirable to track the EML's ER curve through predicting the EML's detuning and to set the bias voltage of EAM 208 to the optimum performance bias voltage point to maintain the transmitter performance with constant characteristics.

EAM 208 may be integrated together with laser 206 by being hermetically sealed in an EML package. For this reason, the temperature of laser 206 and EAM 208 are set the same and maintained because the temperature of both is controlled by a thermoelectric cooler (TEC). Therefore, in theory, the optimal bias point on the ER curve is not affected by the environmental temperature and some other conditions.

However, in transmitter 114, the EAM bias still needs to be automatically adjusted to maintain good transmitter performance. Referring back to FIG. 2, bias control logic 202 is necessary due to two reasons. First, if the laser bias voltage is not constant over temperature the transmitter distortion performance is then affected. Second, the wavelength detuning, however, may not be constant through the lifetime of EML 201 even though the temperature of both the laser 206 and EAM 208 is tightly controlled and maintained by the thermoelectric cooler because of laser aging and due to the laser bias current change by an automatic power control (APC) circuit. Throughout the lifetime of a laser, its threshold becomes larger, and its slope efficiency becomes smaller because of laser aging effects. Thus, the laser output power becomes smaller over time for a fixed laser bias current. The APC circuit in this case increases the laser bias current to maintain a constant laser output power based on the current of a back-facet photodetector in the package of EML 201. Increasing the bias current, however, causes the laser wavelength change. The wavelength change caused by the laser bias current change may be due to a plasma effect and Joule heating effect.

The wavelength change due to the laser aging and APC circuit changing the bias current of laser 206 causes the detuning between the DFB laser wavelength and EAM peak wavelength. The transmitter performance of EML 201 is then affected due to the ER curve's deviation from the original ER curve. Accordingly, some embodiments adjust the EAM voltage bias to optimize and to regain the transmitter performance and transmitter output power.

Conventionally, the EAM bias was controlled by an optical coupler at the output of the EML that taps off a small portion of light power and feeds it to an optical receiver (e.g., a photo detector (PD)) to convert the optical signal back to an electrical signal. The converted electrical signal is then sent to a feedback and bias control (F/C) circuit. The feedback and bias control circuit may contain an RF amplifier and a filter network so that the distortion beat power can be extracted. Using the extracted distortion beat power as an indicator, the bias control circuit can be automatically adjusted to minimize the transmitter distortion.

While effective in optimizing the bias automatically, this approach needs an optical coupler, a photo detector, and electronic feedback and tracking network that all add significant cost and some real estate to the EML transmitter in addition to some complexity in the product design. The optical coupler also adds some insertion loss and thus reduces the transmitter output power.

Another conventional approach uses electrical signals converted by the EAM, which allows the optical coupler and photodetector to be omitted. Unlike the system using the optical coupler and a photodetector to convert the optical signal back to the electrical signal for the feedback and bias control (F/C) network, the optical to electrical signal conversion is accomplished using the intrinsic nature of the EAM because the EAM itself functions as a photo detector. That is, the electro-absorption of the EAM converts a portion of optical power to electrical power. An RF coupler is attached to the EAM to tap off a portion of the signal. The tapped signal is then sent to the feedback and bias control circuit (F/C circuit) to automatically track the distortion beat power and control the EA modulator bias for an optimal distortion performance.

Despite the advantages of the second system over the first one in many aspects, both of them work based on the same principle, controlling the EA modulator bias based on tracked distortion beat power after the optical signal is converted back to the electrical signal. The approach may have some limitations. For example, the power of distortion beat at some targeted frequency may not be strong enough when the transmitter modulation signal's frequency band patterns or signal systems, such as National Television System Committee (NTSC) and Phase Alternating Line (PAL), are different for different applications. Another example is that for some other applications, the system setting may not be based on solely on analog distortion performance. In this case, the distortion beat power may not be a proper gauge for the bias control.

In some embodiments, an alternative way of automatic tracking and bias control is proposed in FIG. 2. Different from the above two approaches, bias control logic 202 predicts EML detuning changes as it evolves over its lifetime. Bias control logic 202 uses the wavelength temperature coefficient of both laser 206 and EAM 208 to generate the EML transmitter performance at different detuning changes. Then, bias control logic 202 uses a predetermined EAM bias curve to optimize EML transmitter performance under different detuning levels. Bias control logic 202 derives the EAM bias voltage from the predetermined EAM bias curve based on the detuning change of EML 201, which is converted from the bias current change of laser 206. The derived bias voltage (or current) from laser 206 is then used to derive the bias voltage source or the bias current source of EAM 208. This also maintains the output power of EML 201 while optimizing its performance throughout its lifetime.

The modulator ER curve moves and varies with a detuning change due to a change in the EML temperature because of the difference of the wavelength temperature coefficient of laser 206 and EAM 208. As described earlier, the EML detuning change can happen throughout its lifetime because of the laser aging and the APC circuit adjustment of the laser's bias voltage even though the EML's temperature is strictly maintained. It is possible that this detuning change is solely determined by the aging of laser 206 because the laser current may be significantly higher than the EAM current, such as for the EML current in the transmitters for HFC applications. For example, the laser current may be as high as 250 mA while the EAM photocurrent might be only about 13 mA. If the laser is biased at 250 mA while the maximum laser current is 300 mA and the coefficient laser wavelength change versus laser bias current change is 0.008 nm/mA, then the wavelength change caused by the current change from 250 mA to 300 mA is 0.4 nm. This 0.4 nm can represent the EML detuning change over its lifetime if the EML temperature stays constant.

Figure 5:
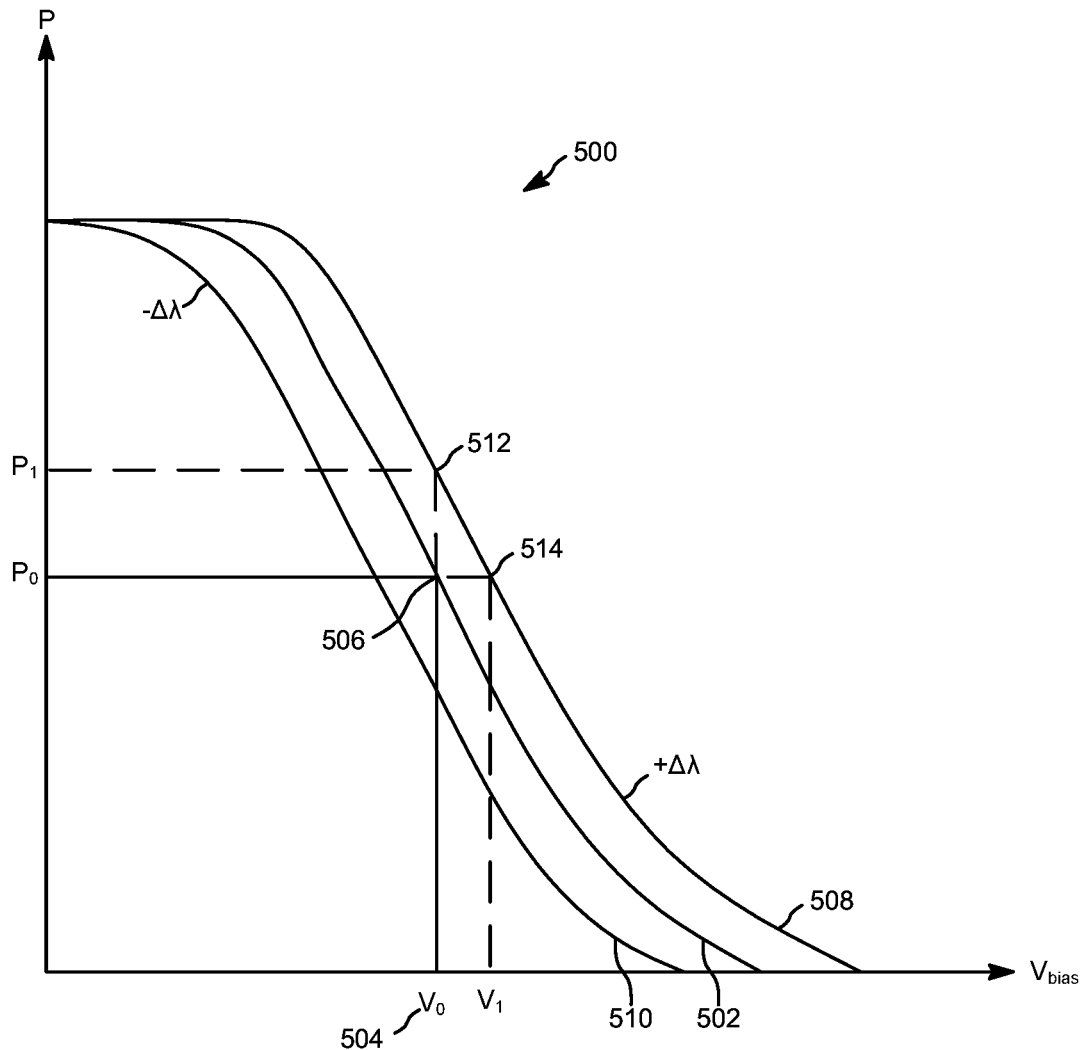
FIG. 5 depicts a graph that shows the impact of the detuning change on the performance of the EML according to some embodiments.

FIG. 5 depicts a graph 500 that shows the impact of the detuning change on the performance of EML 201 according to some embodiments. An original ER curve is shown at 502 and is biased at $v_0$ at 504. The inflection point for predetermined modulation performance, such as the optimal composite second order performance, is achieved when the output power of EML 201 is then set to $P_0$ at 506. When a detuning, $\Delta\lambda$, of EML 201 occurs, then the ER curve shifts, such as to the right to a curve at 508 or to the left to a curve at 510. However, when the ER curve shifts, the original EAM bias is off from the new ER curve's inflection point, and the composite second order distortion of EAM 208 is degraded. That is, a point 512 on ER curve 508 is off from the inflection point on that curve if the EAM bias voltage stays unchanged at voltage $v_0$.

To maintain a similar composite second order performance, bias control logic 202 causes the EAM bias point to be moved to another inflection point 514 on the new ER curve 508. This inflection point 514 corresponds to an EAM bias voltage vi. To perform this change, bias control logic 202 tracks the detuning change by monitoring the laser bias current change and sets the EAM bias to its inflection point automatically. Bias control logic 202 predicts the ER curve change during the lifetime of EML 201 based on the known laser and EAM temperature coefficients and optimum EAM bias setting curve, and can set the predetermined optimal EAM bias voltage for EAM 208 near each detuning point.

The prediction of the EML detuning curve is made possible if the wavelength temperature coefficient of both laser 206 and EAM 208 is known. In some examples, the wavelength temperature coefficient of laser 206 is 0.1 nm/C and that of EAM 208 is 0.4 nm/C. Therefore, a 0.4 nm detuning change can be simulated by 0.4 nm/(0.4−0.1)=1.3 C temperature change of EML 201. The lines in FIG. 4 can thus be used to visualize the change in the ER curve due to a detuning change by relating the change in the ER curve due to temperature change to the equivalent change due to a detuning change caused by the laser bias change. That means the performance of EAM 208 over the laser bias current change over the lifetime of EAM 208 can be produced by setting the temperature of EML 201. The small DFB temperature for the simulation can still cause some laser power change and laser bias change due to APC circuit. The bias change due to the APC circuit is less than 4 mA when the laser temperature changed by 1.3 C, which introduces additional detuning change of 4*0.008=0.032 nm and can be ignored compared to a 0.3 nm detuning change.

By predicting the detuning or the optimum EAM bias point at different detuning levels due to the EML aging and the APC circuit control of the laser bias voltage, bias control logic 202 uses an optimum detuning-EAM bias curve, which may be established by experimental simulation of some detuning points due to aging and optimum setting of the EAM at these detuning points, to control the transmitter performance. The EAM bias curve may include several preset temperature points for the targeted detuning points to cover the range of detuning changes and a desired bias voltage for EAM 208 at each detuning point. Since the EML detuning change and laser bias current change can be inter-converted, the detuning change can then be tracked by the bias current change, the predetermined EAM bias curve can be in the form of bias voltage versus detuning change or bias voltage versus laser bias current change. The predetermined EAM bias curve is then used to automatically control EAM bias and to maintain the optimal targeted transmitter performance throughout its lifetime. In some embodiments, the predetermined EAM bias curve may be implemented in different ways, such as via a lookup table or other type of data structure.

Figure 6A:
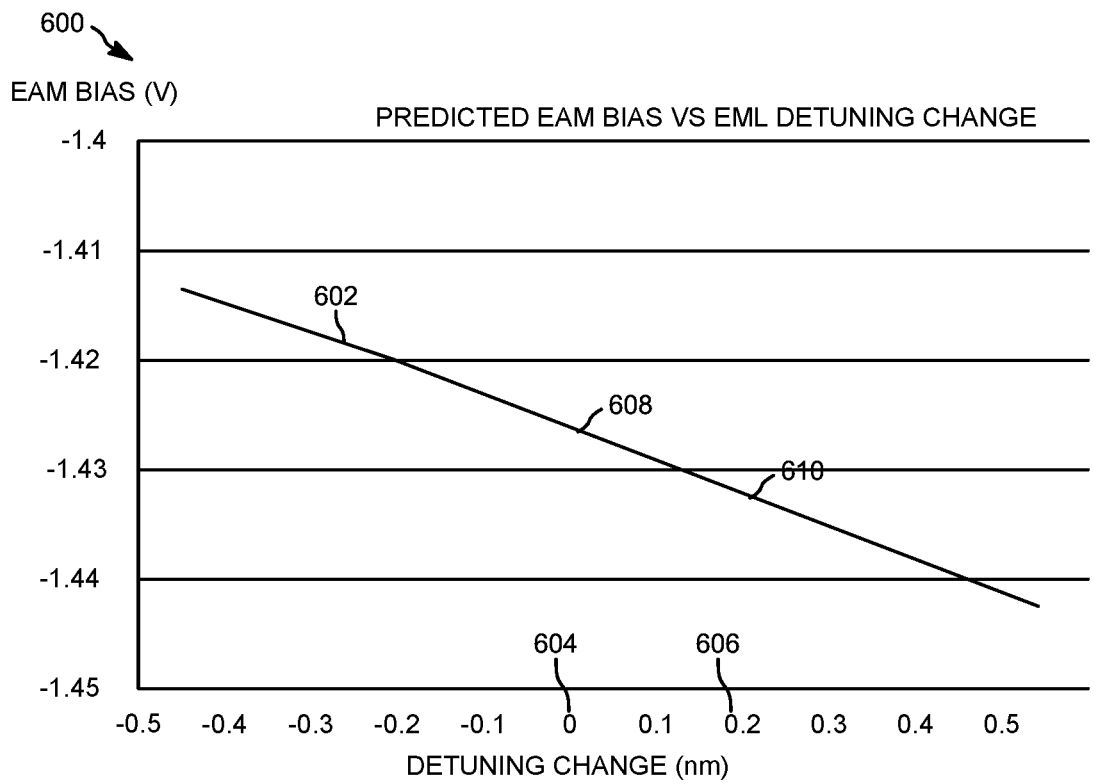
FIG. 6A shows an example of the predetermined EAM bias curve over detuning change according to some embodiments.

FIG. 6A shows an example of the predetermined EAM bias curve 600 over detuning change according to some embodiments. The detuning may change because of temperature changes and instead of using the detuning change on the X axis, the X axis may be the temperature change of EML 201. In this example, the initial temperature of the EML is 23.3 C and temperature range is +/−1.5 degrees, which causes a detuning change from around −0.45 to +0.45 nm. Other changes may also be appreciated.

A curve 602 shows the relationship between EAM bias voltage and the detuning change. As the detuning changes, bias control logic 202 can determine the new EAM bias voltage. For example, if the detuning starts at zero at 604 and changes to 0.2 at 606, bias control logic 202 can change the EAM bias voltage from approximately −1.425 to −1.432 (from point 608 to point 610).

Figure 6B:
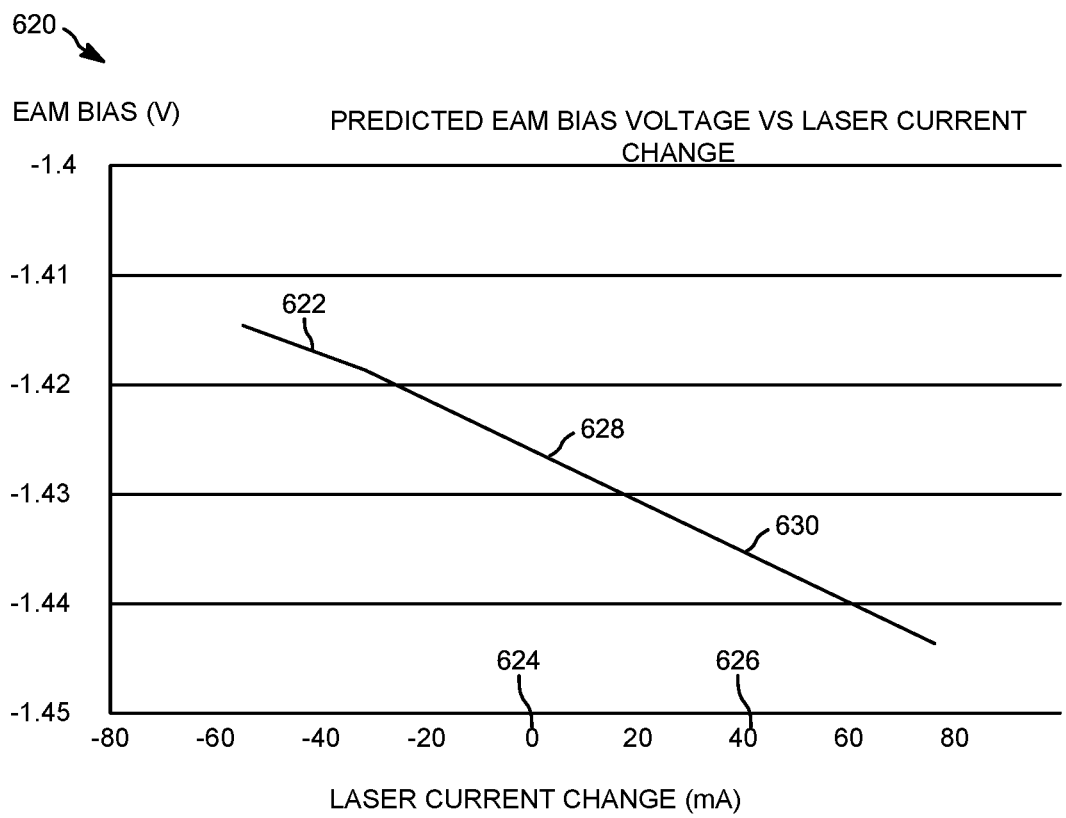
FIG. 6B shows an example of the predetermined EAM bias curve over laser current change according to some embodiments.

FIG. 6B shows an example of the predetermined EAM bias curve 620 over laser bias current change according to some embodiments. The initial temperature of the EML is 23.3 C and temperature range is +/−1.5 degrees. A curve 622 shows the relationship between EAM bias voltage and the current change. As the laser current changes, bias control logic 202 can determine the new EAM bias voltage. For example, if the laser current starts at 0 mA at 624 and changes to 40 mA at 626, bias control logic 202 can change the EAM bias voltage from approximately −1.425 to −1.437 (from point 628 to point 630). Although the above curves were shown in FIGS. 6A and 6B, other curves may be used.

Figure 7:
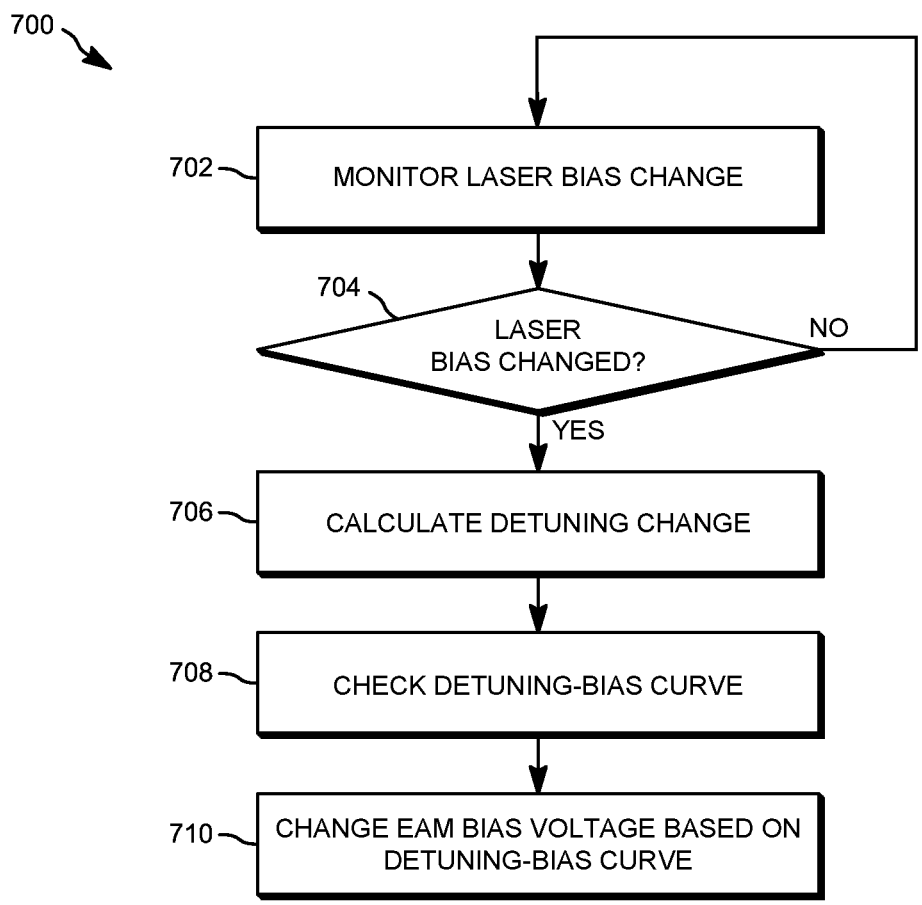
FIG. 7 depicts a simplified flowchart of a method for adjusting the bias voltage of EAM 208 according to some embodiments.

FIG. 7 depicts a simplified flowchart 700 of a method for adjusting the bias voltage of EAM 208 according to some embodiments. At 702, bias control logic 202 monitors for a laser bias current change. At 704, bias control logic 202 determines if the laser bias voltage has changed. If not, the process goes back to laser bias current change monitoring.

At 706, bias control logic 202 calculates the detuning change that results from the laser bias voltage change. Then, at 708, bias control logic 202 analyzes the detuning-bias curve and calculates the new EMA bias voltage. Alternatively, the laser current change-bias curve may be used. Bias control logic 202 can then determine a new EAM bias voltage based on the curve. Then, at 710, bias control logic 202 changes the EAM bias voltage based on the detuning-bias curve.

Figure 8:
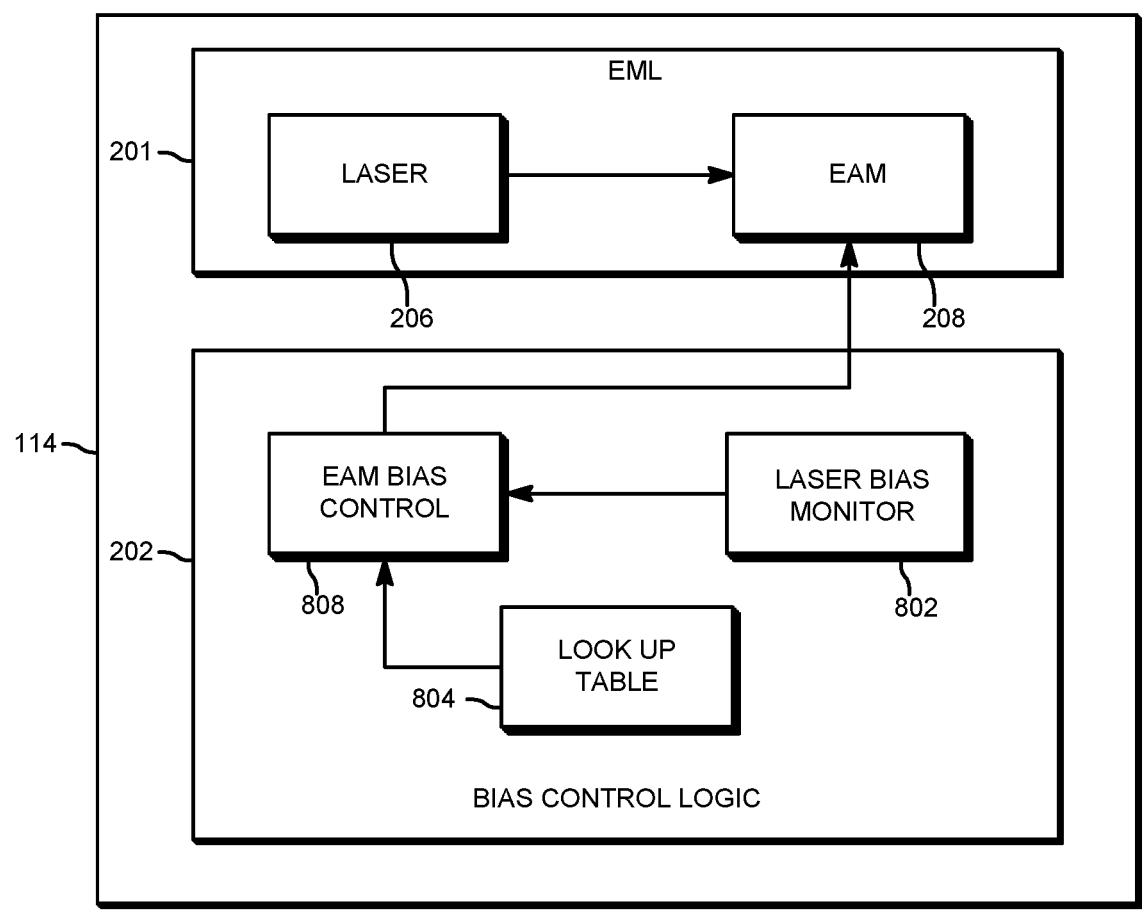
FIG. 8 depicts a more detailed example of bias control logic according to some embodiments.

FIG. 8 depicts a more detailed example of bias control logic 202 according to some embodiments. Bias control logic 202 includes a laser bias monitor 802 that in turn monitors the detuning change due to the bias current change of laser 206. When a change is detected, EAM bias control 808 uses the change to look up a change in the EAM bias voltage using lookup table 804. In some embodiments, the change in the detuning or the current corresponds to a value interpolated or extrapolated from the lookup table 804. EAM bias control 808 then changes the bias voltage of EAM 208 based on the value derived from lookup table 804.

Figure 9:
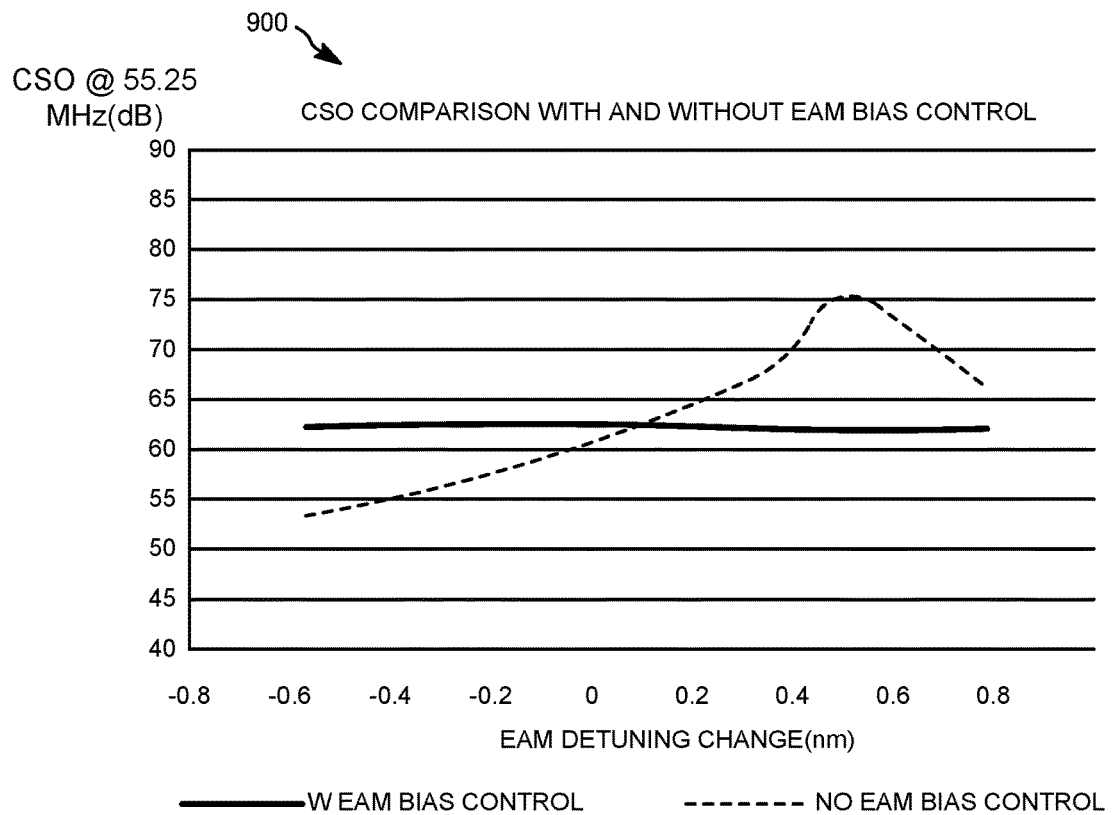
FIG. 9 depicts results of the composite second order (CSO) performance at different EML detuning changes with and without EAM bias voltage control according to some embodiments.
Figure 9:
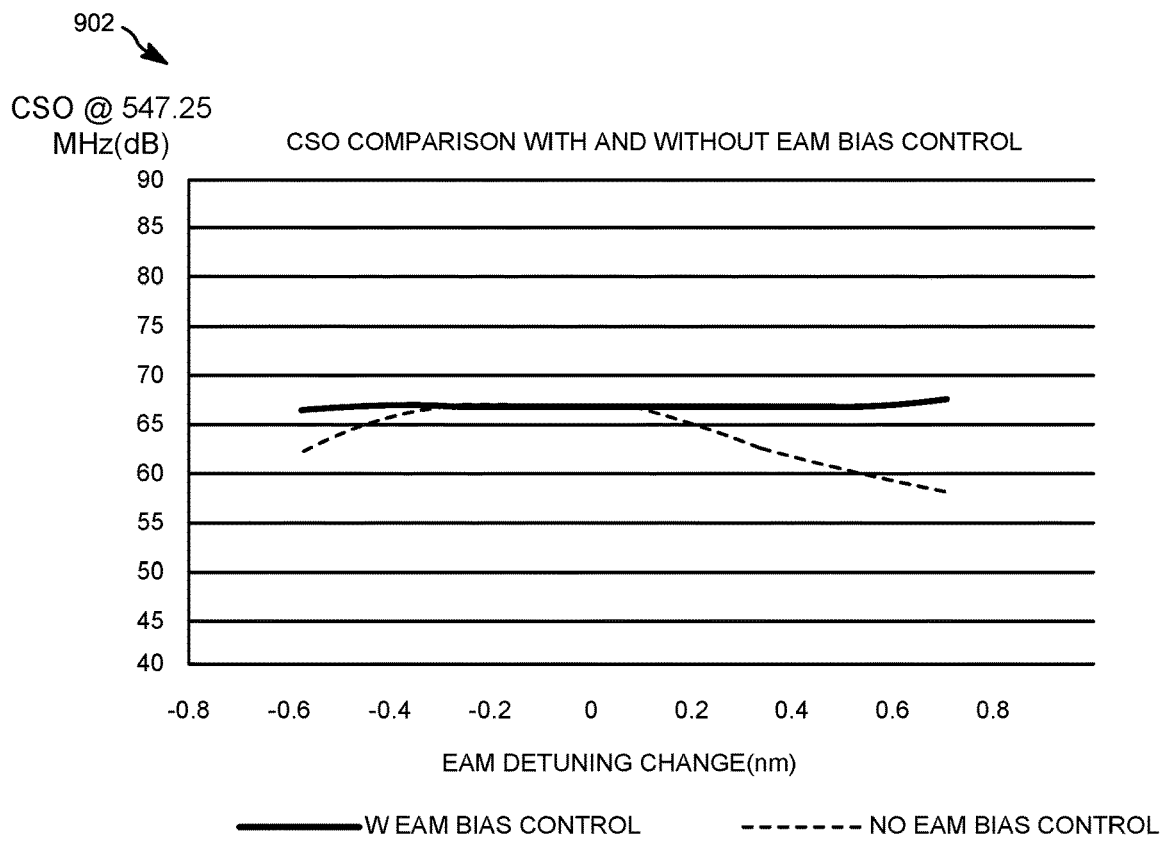

FIG. 9 depicts results of the composite second order (CSO) performance at different EML detuning changes with and without EAM bias voltage control according to some embodiments. The detuning represented is caused by the laser bias current change and is simulated by setting the EML's temperature. The EAM control voltage at each detuning point is derived from the predetermined EAM bias curve/table for the targeted optimal CSO. Some EAM biases are derived from interpolation of the predetermined curve/table while some others are derived from the extrapolation. The transmitter was loaded with 79 analog subcarriers and 75 QAM channels at −6 dB relative to the subcarrier power to make a total bandwidth of 1 GHz. The composite second order (CSO) beats are measured and monitored at near 55.25 MHz at 900 and 547.25 MHz at 902 where the most distortion beats happen. It is seen that with EAM bias automatic control based on the predetermined EAM bias curve/table, the transmitter's CSO performance is well maintained.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. An apparatus comprising:
an electro-absorption modulator configured to receive an optical light from an optical light source and output a modulated optical signal, the electro-absorption modulator including a bias voltage that is used to set a predetermined modulation performance and an output power of the electro-absorption modulator; and
a controller configured to measure a bias current of the optical light source and use a change of the bias current to determine a detuning change that occurs between the electro-absorption modulator and the optical light source, wherein the controller uses the detuning change to automatically control the bias voltage of the electro-absorption modulator to maintain the predetermined modulation performance and maintain the output power of the electro-absorption modulator.

2. The apparatus of claim 1, further comprising:
an automatic power control circuit that controls the bias current of the optical light source to maintain a same output power from the optical light source.

3. The apparatus of claim 2, wherein a wavelength of the optical light source is changed by changing the bias current of the optical light source, which causes the detuning change.

4. The apparatus of claim 1, wherein the bias voltage of the electro-absorption modulator is adjusted to achieve the predetermined modulation performance and maintain the output power simultaneously.

5. The apparatus of claim 1, wherein the controller comprises:
a data structure that lists detuning changes versus the change of the bias current of the optical light source, and
the data structure is used to determine the bias voltage of the electro-absorption modulator based on the detuning change.

6. The apparatus of claim 1, wherein:
the detuning change is used to determine a temperature change for simulating performance of the optical light source and the electro-absorption modulator and pre-determining the electro-absorption modulator bias voltage versus the detuning based on known temperature coefficients of the optical light source and the electro-absorption modulator.

7. The apparatus of claim 1, wherein the controller comprises:
a data structure that lists bias voltages for the electro-absorption modulator versus the change of the bias current of the optical light source based on the detuning changes, and
the data structure is used to determine the bias voltage of the electro-absorption modulator based on a bias current change.

8. The apparatus of claim 1, wherein the controller maintains modulation linearity performance by controlling the bias voltage of the electro-absorption modulator.

9. The apparatus of claim 1, wherein the controller maintains second order distortion changes that occur based on the detuning changes by controlling the bias voltage of the electro-absorption modulator.

10. The apparatus of claim 1, wherein the controller maintain even order distortion changes that occur based on the detuning changes by controlling the bias voltage of the electro-absorption modulator.

11. The apparatus of claim 1, further comprising:
a temperature control circuit configured to maintain a temperature of the optical light source and the electro-absorption modulator.

12. The apparatus of claim 1, wherein the optical light source comprises a distributed feedback laser (DFB) laser.

13. The apparatus of claim 1, wherein the optical light source and the electro-absorption modulator are located in a same package.

14. The apparatus of claim 1, wherein the optical light source and the electro-absorption modulator form an electro-absorption modulated laser (EML).

15. The apparatus of claim 1, wherein the predetermined modulation performance of the apparatus and an output power of the apparatus is set by controlling the bias voltage of the electro-absorption modulator.

16. A method comprising:
receiving, by a computing device, a bias current of an optical light source that outputs an optical light to an electro-absorption modulator, the electro-absorption modulator configured to output a modulated optical signal and including a bias voltage that is used to set a predetermined modulation performance and an output power of the electro-absorption modulator;
comparing, by the computing device, the received bias current with the initial bias current to determine a detuning change that occurs between the electro-absorption modulator and the optical light source; and
using, by the computing device, the detuning change to automatically control the bias voltage of the electro-absorption modulator to maintain the predetermined modulation performance and maintain the output power of the electro-absorption modulator.

17. The method of claim 16, wherein using the detuning change comprises:
using a data structure that lists detuning changes versus a change of the bias current of the optical light source to determine the bias voltage of the electro-absorption modulator based on the detuning change.

18. The method of claim 16, wherein using the detuning change comprises:
using a data structure that lists bias voltages for the electro-absorption modulator versus a change of the bias current of the optical light source based on the detuning changes to determine the bias voltage of the electro-absorption modulator based on a bias current change.

19. The method of claim 16, wherein:
the detuning change is used to determine a temperature change for simulating performance of the optical light source and the electro-absorption modulator and pre-determining the electro-absorption modulator bias voltage versus the detuning based on known temperature coefficients of the optical light source and the electro-absorption modulator.

20. A system comprising:
an optical light source configured to generate an optical light;
an electro-absorption modulator configured to receive the optical light from the optical light source and output a modulated optical signal, the electro-absorption modulator including a bias voltage that is used to set a predetermined modulation performance and an output power of the electro-absorption modulator; and
a controller configured to measure a bias current of the optical light source and use a change of the bias current to determine a detuning change that occurs between the electro-absorption modulator and the optical light source, wherein the controller uses the detuning change to automatically control the bias voltage of the electro-absorption modulator to maintain the predetermined modulation performance and maintain the output power of the electro-absorption modulator.

* * * * *